(12) United States Patent
Hu et al.

(10) Patent No.: US 10,873,329 B2
(45) Date of Patent: Dec. 22, 2020

(54) HIGH RELIABILITY AC LOAD SWITCHING CIRCUIT

(71) Applicant: IDEAL INDUSTRIES LIGHTING LLC, Durham, NC (US)

(72) Inventors: Yuequan Hu, Cary, NC (US); Amruteshwar Hiremath, Morrisville, NC (US); Kory A. Liszt, Apex, NC (US)

(73) Assignee: Ideal Industries Lighting LLC, Sycamore, IL (US)

( * ) Notice: Subject to any disclaimer, the term of this patent is extended or adjusted under 35 U.S.C. 154(b) by 0 days.

(21) Appl. No.: 16/385,020

(22) Filed: Apr. 16, 2019

(65) Prior Publication Data

US 2019/0245537 A1    Aug. 8, 2019

Related U.S. Application Data

(63) Continuation of application No. 15/191,972, filed on Jun. 24, 2016, now abandoned.

(51) Int. Cl.
| | |
|---|---|
| *H01H 31/10* | (2006.01) |
| *H01H 33/59* | (2006.01) |
| *H01H 47/00* | (2006.01) |
| *H01H 85/46* | (2006.01) |
| *H01H 19/14* | (2006.01) |
| *H03K 17/68* | (2006.01) |
| *H02H 9/00* | (2006.01) |

(52) U.S. Cl.
CPC ............. *H03K 17/68* (2013.01); *H02H 9/002* (2013.01); *H03K 2217/0009* (2013.01)

(58) Field of Classification Search
CPC ............. H03K 17/68; H03K 2217/009; Y10T 307/74; Y10T 307/76; H02J 3/14; H01H 35/00; H01H 45/00; H02H 9/002
See application file for complete search history.

(56) References Cited

U.S. PATENT DOCUMENTS

| | | | |
|---|---|---|---|
| 5,270,576 A | 12/1993 | Kahle | |
| 5,473,202 A * | 12/1995 | Mudge | H03K 17/945 307/116 |
| 5,633,540 A * | 5/1997 | Moan | H01H 9/542 307/125 |
| 6,330,140 B1 | 12/2001 | Wilson-Jones et al. | |

(Continued)

*Primary Examiner* — Rexford N Barnie
*Assistant Examiner* — Rasem Mourad
(74) *Attorney, Agent, or Firm* — Myers Bigel, P.A.

(57) ABSTRACT

A high reliability AC load switching circuit is disclosed. In some embodiments, the AC load switching circuit includes a high-speed switch connected between the load and the voltage source, a cutoff switch connected between the load and the voltage source in parallel with the high-speed switch, and a level detector connected to the voltage source and to a control input of the high-speed switch. The high-speed switch may be a solid-state switch, for example, a TRIAC or a bidirectional switch, and the cutoff switch may be an electromechanical switch, for example, a relay. In some embodiments a snubber is connected in parallel with a solid-state switch. In some embodiments a microcontroller is connected to an electromechanical switch and the level detector. In some embodiments, both a first cutoff switch and a second cutoff switch are used.

16 Claims, 7 Drawing Sheets

(56) References Cited

U.S. PATENT DOCUMENTS

| | | | |
|---|---|---|---|
| 2007/0285027 A1* | 12/2007 | Gehman | H01H 23/02 |
| | | | 315/209 SC |
| 2011/0063759 A1 | 3/2011 | Billingsley et al. | |
| 2014/0210427 A1 | 7/2014 | Pishdadian | |
| 2015/0280426 A1* | 10/2015 | Huang | H02H 9/002 |
| | | | 361/100 |

* cited by examiner

HIGH RELIABILITY AC LOAD SWITCHING CIRCUIT

CROSS-REFERENCE TO RELATED APPLICATION

The present application is a continuation application of U.S. application Ser. No. 15/191,972, filed on Jun. 24, 2016. The disclosure of which is incorporated herein by reference in its entirety.

BACKGROUND

Plug-in loads are now the third highest contributor to electricity usage next to lighting and HVAC (heating, ventilation and air conditioning) in most office buildings, and this situation is expected to increase as more occupants use individual devices such as computers, displays, and printers. Some commercial building electrical systems are being designed to automatically reduce power use in unoccupied spaces through automatic receptacle control for at least some of the receptacles in the building.

Receptacles in such building are normally powered via a switching circuit. When the switching circuit is turned on, electric current flows to the load. Often, a large in-rush current occurs, which can trip a circuit breaker if the switching circuit does not have proper control of the turn-on moment for capacitive loads. In switching circuits based on solid-state devices, excessive power loss and heat may result if the load draws high current, leading to failure of the component if cooling is inadequate. Some semiconductor devices can become leaky and allow current to flow to the load even when shut off, depending on temperature and other factors, which can cause abnormal operation of the load and wasted power.

SUMMARY

Embodiments of the present invention include a high-speed switch or switching device such as a triode for alternating current (TRIAC) or a bidirectional solid-state switch, at least one cutoff switch, and a zero-crossing detection and control circuit, which may be referred to herein as a "level detector." The cutoff switch may be or include an electromechanical switch, as an example, a relay.

In some embodiments, a switching circuit to selectively connect a load to a voltage source includes a high-speed switch connected between the load and the voltage source, a cutoff switch connected between the load and the voltage source in parallel with the high-speed switch, and a level detector connected to the voltage source and to a control input of the high-speed switch. In some embodiments a snubber is connected in parallel with the high-speed switch. In some embodiments a microcontroller is connected to the cutoff switch and the level detector.

Some of the above embodiments include at least a first cutoff switch and a second cutoff switch, with the second cutoff switch being connected in series with the high-speed switch and the first cutoff switch. The second cutoff switch can be connected either between the high-speed switch and the voltage source or between the high-speed switch and the load.

In any of the above embodiments, the high-speed switch can be or include a solid-state switch. In any of these embodiments, the solid-state switch can be or can include a triode for alternating current (TRIAC) or a bidirectional switch. If the cutoff switch is implemented with an electromechanical switch such as a relay, and a microcontroller is used to control the switching circuit, a transistor can be connected to the microcontroller, and a resistor can then be connected between the transistor and the electromechanical switch to allow the microcontroller to control the electromechanical switch. This configuration can be used for a single electromechanical switch or each of multiple electromechanical switches.

The switching circuit can be operated according to example embodiments of the invention by firmware or control circuitry. The switching circuit is operated by turning on a solid-state switch between the voltage source and the load at zero-crossing of the AC voltage, and activating a first electromechanical switch connected in parallel with the solid state switch after the turning on of the solid-state switch. When the circuit is turned off or powered down, the first electromechanical switch is deactivated and then the solid-state switch is turned off.

If a second electromechanical switch is connected in series with the solid-state switch it is turned on prior to turning on the solid-state switch in response to activation of the switching circuit. During power-down, the first electromechanical switch is deactivated, followed by the turning off of the solid-state switch and the deactivation of second electromechanical switch.

DETAILED DESCRIPTION

Figure 1:
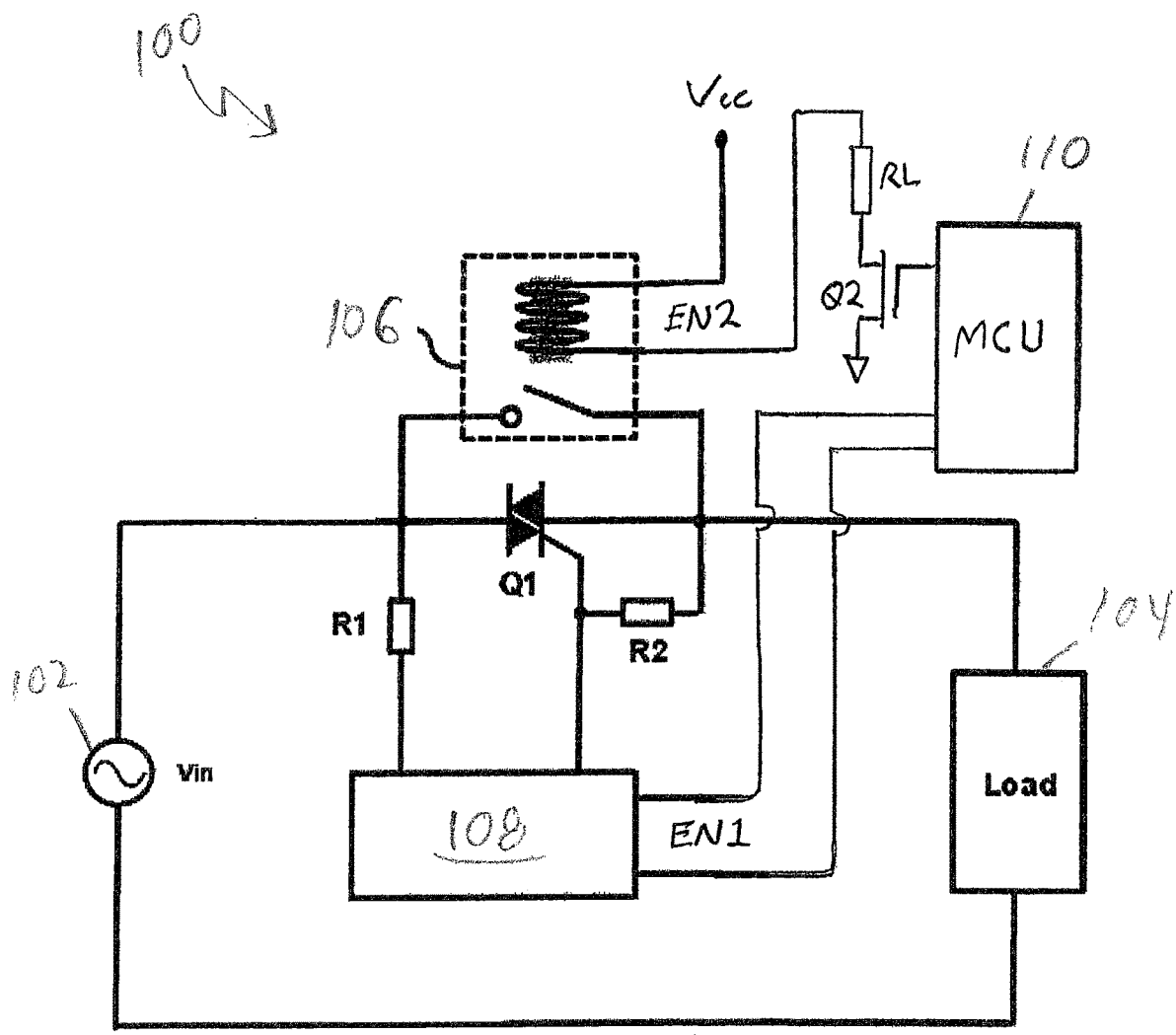
FIG. 1 is a schematic diagram illustrating a switching circuit according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

A high-reliability AC load switch according to embodiments of the invention is provided by a switching circuit, which might also be termed a power control module. The power control module or switching circuit includes circuit configurations and a control process.

FIG. 1 is a schematic diagram showing an example embodiment of the present invention. The switching circuit 100 selectively connects voltage source 102 to load 104. The switching circuit includes a semiconductor device that acts as a high-speed switch, in this example, a TRIAC Q1, a cutoff switch, which in this example is relay 106, and a zero-crossing detection and control circuit, level detector 108. A commercially available integrated zero-crossing detection and control circuit, such as part number MOC3043 from Fairchild Semiconductor, can be used as a level detector with embodiments of the invention. Such a device acts as a latching, optically coupled TRIAC driver by tracking the AC voltage waveform and detecting its instantaneous level, thereby determining when that level is zero volts because of a "zero-crossing" of the voltage waveform. Resistors R1 and R2 are used to provide the desired driving current for the TRIAC. The solid-state semiconductor device (TRIAC) Q1 is connected in parallel with the electro-mechanical switch 106.

Still referring to FIG. 1, microcontroller unit (MCU) 110 is connected to enabling input number one (EN1) to enable level detector 108 to turn on the TRIAC at the zero-crossing of the AC voltage that occurs next after the enabling input EN1 becomes active. Thus, when the load (such as a printer, a computer, a lighting fixture, etc.) needs to be powered on, the solid-state switch is turned on only at zero-crossing of the applied source voltage and with the enabling control signal EN1 applied. The level of an enabling control signal can be HIGH or LOW depending on the type of microcontroller used and how the circuit is connected. For purposes of this disclosure, it can be assumed that a level of HIGH is used to enable or turn on a component while a level of LOW is used to disable or turn off a component. Since the input voltage is applied to the load(s) at zero-crossing, the in-rush current due to any capacitive load, such as the EM1 filtering capacitors or the bulk capacitors for smoothing voltage in a personal electronic device, is significantly reduced compared to turning on the power at moments other than that of zero-crossing. After the solid-state switch is turned on, the electromechanical switch 106 is turned on with enabling control signal two (EN2). As the voltage across the solid-state switch is generally low, mostly around 1 V, arcing or welding (tack welding) of the contacts of the relay doesn't occur even if bouncing happens when the electromechanical switch is being closed.

When the electrical/electronic equipment needs to be powered off, the electromechanical switch 106 is turned off by the MCU setting control signal EN2 LOW while the solid-state switch is still on with EN1 being maintained HIGH. After the electromechanical switch 106 is turned off, the solid-state switch Q1 is then turned off with the control voltage EN1 being changed to LOW. With the two components connected in parallel turned off, there is only a small leakage current flowing to the load(s) and for many practical applications, the load(s) are considered powered off Continuing with FIG. 1, it should also be noted that for the MCU to properly drive a relay, it may need to be connected to a transistor such as transistor Q2 as well as a current limited resistor such as resistor RL. Many types of controllers can be used, including digital signal processors and microprocessors of various types. Dedicated circuitry or an application specific integrated circuit (ASIC) can also be used as an MCU to provide the turn-on/turn-off signals for the enabling inputs EN1 and EN2. An MCU may or may not be able to drive a relay directly, depending on the outputs provided. The relay may be referred to as an electromechanical switch, or as a cutoff switch, since the purpose of using such a device is to completely cut off current flow with no leakage.

Figure 2:
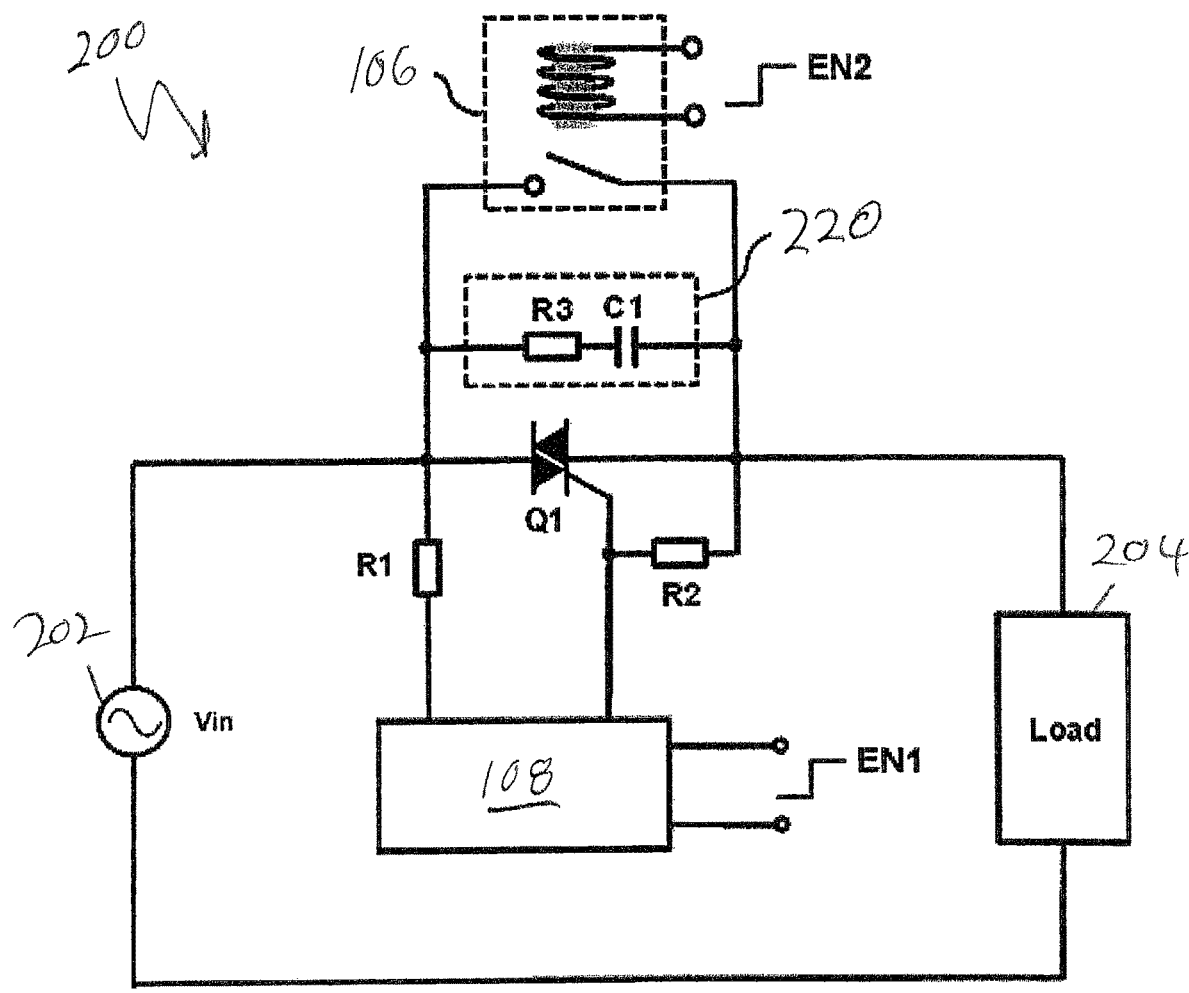
FIG. 2 is a schematic diagram illustrating a switching circuit according to additional embodiments of the present invention.

FIG. 2 is a schematic diagram of another embodiment of the present invention. Switching circuit 200 of FIG. 2 selectively connects voltage source 202 to load 204. The circuit of FIG. 2 uses the same TRIAC Q1, relay 106 and resistors R1 and R2, but includes a snubber 220 comprising resistor R3 and capacitor C1, connected in parallel with TRIAC Q1 to suppress voltage spikes and dampen ringing that might be caused by circuit inductance or an inductive load. Such ringing could cause the misfiring of the TRIAC when the TRIAC needs to be turned off A misfiring of the TRIAC could turn on the power when not desired. The elimination of ringing from any of these causes can result in a switching circuit with higher reliability and lower electromagnetic interference (EMI). It can be assumed that the same type of microcontroller unit (MCU) is connected to the same enabling inputs EN1 and EN2 as already discussed. The MCU and supporting circuitry for driving relay 106 are omitted in FIG. 2 for simplicity and clarity of illustration.

Figure 3:
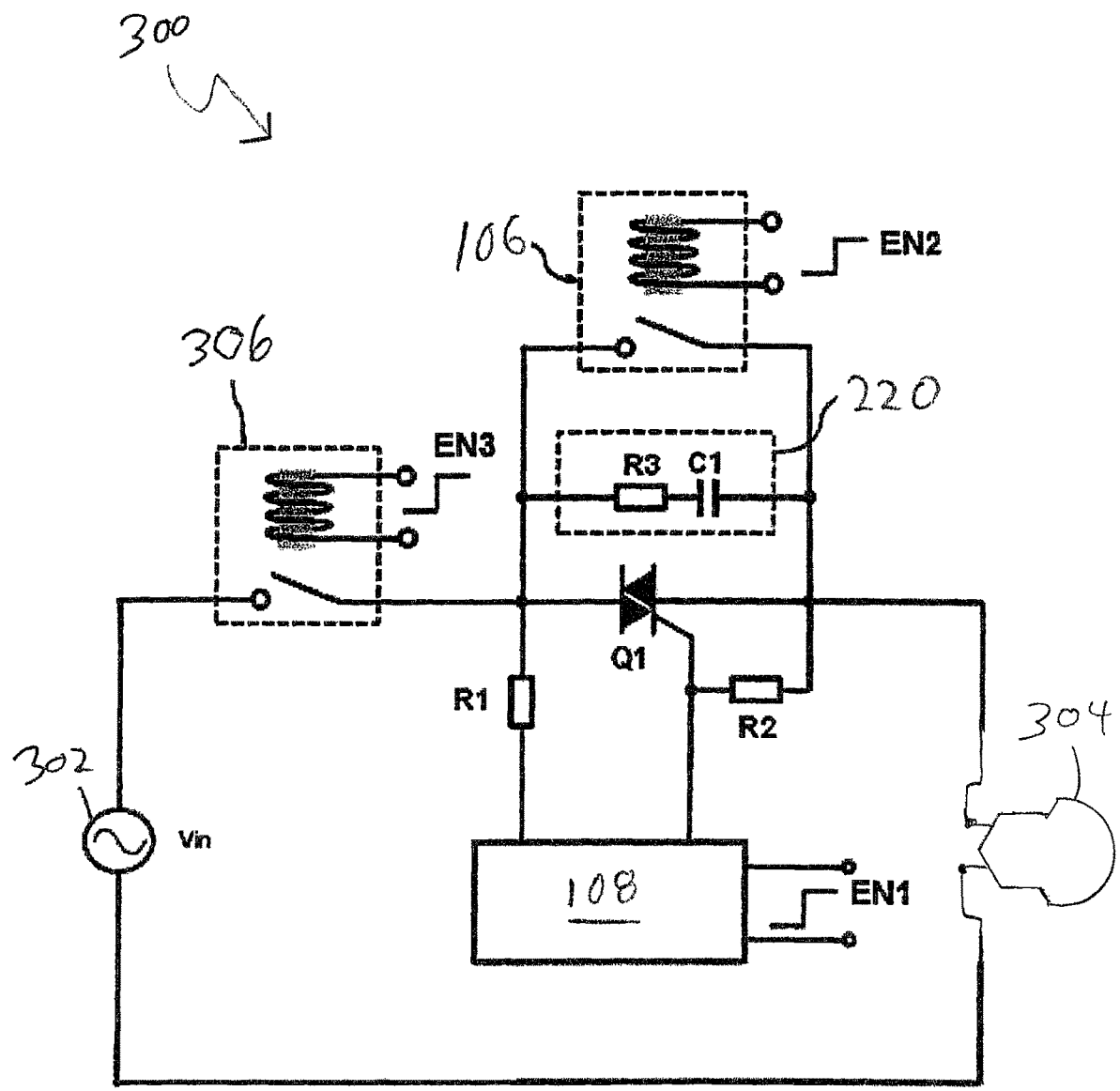
FIG. 3 is a schematic diagram illustrating a switching circuit according to further embodiments of the present invention.

FIG. 3 shows a schematic diagram of an additional embodiment of the present invention with a second cutoff switch connected in series with the solid-state switch. Such an implementation works well where the leakage current must be further minimized, such as with small devices where the leakage current would be a significant percentage of the operating current. Such a device might be, as an example, an LED lighting system such as a lamp, down-light, emergency light, or the like. The purpose of using a second cut-off switch is to completely turn off the power since a semiconductor switch such as the TRIAC may allow leakage current depending on the operating temperature. Circuit 300 of FIG. 3 selectively connects voltage source 302 to LED lamp 304. The circuit of FIG. 3 uses the same TRIAC Q1, the same relay 106 as a first cutoff switch, resistors R1 and R2, as well as snubber 220 comprising resistor R3 and capacitor C1. However, circuit 300 of FIG. 3 includes a second cutoff switch, relay 306 connected in series with TRIAC Q1. The second relay 306 in this example is connected between the voltage source and the solid-state switch, and is enabled by enabling input three (EN3), which is in turn connected to the microcontroller unit (MCU, not shown).

With the circuit of FIG. 3, when electrical/electronic equipment (such as a printer, a computer or a lighting fixture etc.) needs to be powered on, the second electromechanical switch 306 is turned on first by control signal EN3, then the solid-state switch Q1 is turned on at zero-crossing of the applied source voltage after being enabled by control signal EN1, and finally the first electromechanical switch 106 is turned on by control signal EN2. As before, since the input voltage is applied to the load(s) at zero-crossing, the in-rush current due to any capacitive load, such as the EMI filtering capacitors or the bulk capacitors for smoothing voltage, is significantly reduced compared to turning on the power at moments other than zero-crossing.

When the electrical/electronic equipment needs to be powered off, the first electromechanical switch 106 is turned off by control signal EN2, then the solid-state switch Q1 is turned off by control signal EN1, and finally, the second electromechanical switch 306 is turned off by changing the level of control signal EN3 from HIGH to LOW. In this "off" configuration, no current flows through the load(s) as second electromechanical switch 306 completely opens the circuit so that there can be no leakage current. This implementation works for any size loads(s)—small, medium or large.

Figure 4:
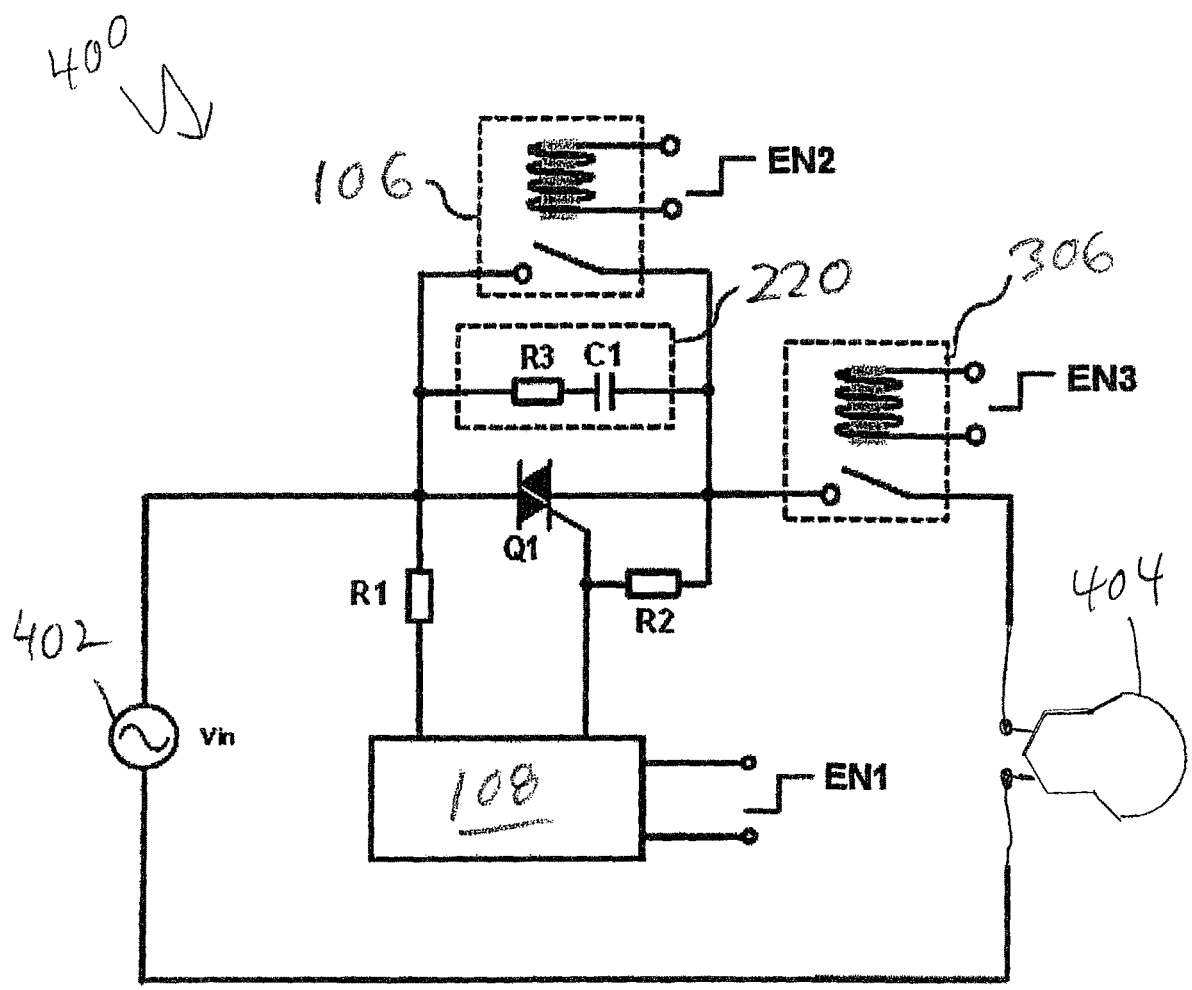
FIG. 4 is a schematic diagram illustrating a switching circuit according to more example embodiments of the present invention.

FIG. 4 is a schematic diagram of another embodiment of the present invention. Circuit 400 of FIG. 4 selectively connects voltage source 402 to LED lamp 404. All of the same components are used as in circuit 300 of FIG. 3. However, second cutoff switch (relay) 306 is in this case connected between the solid-state switch Q1 and the load. It should be noted that the second relay can also be said to be connected in series with the first relay (first cutoff switch) in either of the embodiments with two electromechanical switches described above. Also, snubber 220 can be omitted from a circuit with two electromechanical switches, so that the switching circuit is similar to that shown in FIG. 1 except with a second electromechanical switch. The snubber can be omitted while still minimizing spikes and ringing if a TRIAC with built-in ringing suppression is used. Such so-called "snubberless" TRIACs include part numbers T2035H-6T and BTA24-600CWRG from ST Microelectronics.

Figure 5:
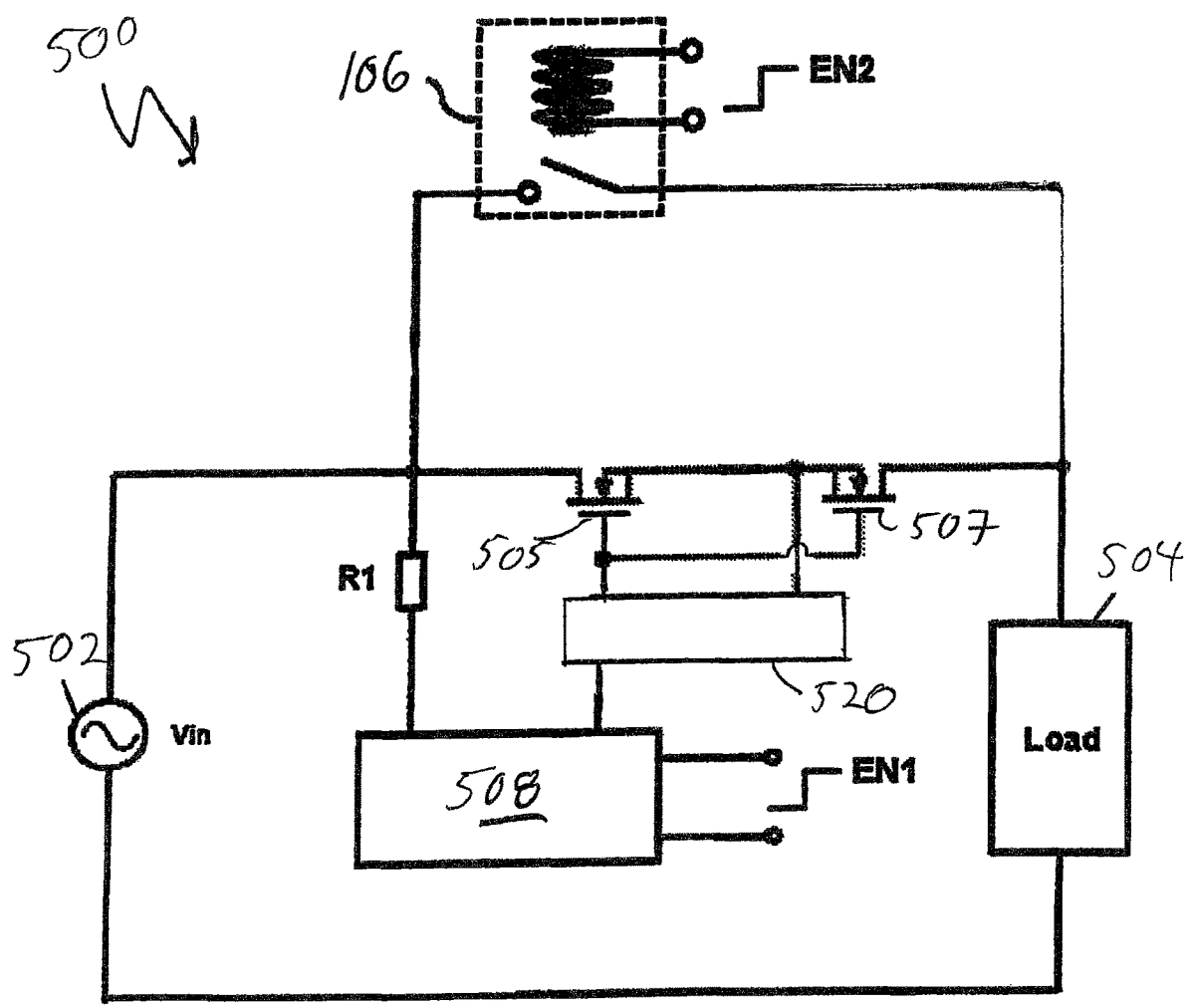
FIG. 5 is a schematic diagram illustrating additional embodiments of the invention where a bidirectional transistor switch is used.

FIG. 5 is a schematic diagram of another embodiment of the present invention. Switching circuit 500 of FIG. 5 selectively connects voltage source 502 to load 504. The circuit of FIG. 5 uses the same relay 106 and resistor R1 but for a high-speed switch uses a bidirectional switch based on transistors 505 and 507. Transistor 505 is an n-MOSFET and transistor 507 is a p-MOSFET. It can be assumed that the same type of microcontroller unit (MCU) is connected to the same enabling inputs EN1 and EN2 as already discussed and can be programmed to control switching circuit 500. The MCU and supporting circuitry for driving relay 106 are omitted in FIG. 5 for simplicity and clarity of illustration.

Still referring to FIG. 5, level detector 508 determines zero crossing of the AC voltage waveform as before, and uses this information to activate the relay and the bidirectional switch. However, supporting circuitry 520 is used to drive the bidirectional switch. As an example, this supporting circuitry can include a transformer to provide an isolated gate-control signal to turn on or turn off transistors 505 and 507 simultaneously. A pulse signal source with enough driving capability to provide an appropriate pulse signal is connected to the primary side of the transformer. Integrated circuits designed for the purpose of providing a driving pulse signal to a transformer can be obtained, or a discrete circuit for this purpose can be built. The same microcontroller that is used for the other control functions of the switching circuit may instead be able to provide this pulse signal if the appropriate type and model of microcontroller is selected. Alternatively, a second microcontroller can instead be provided.

Figure 6:
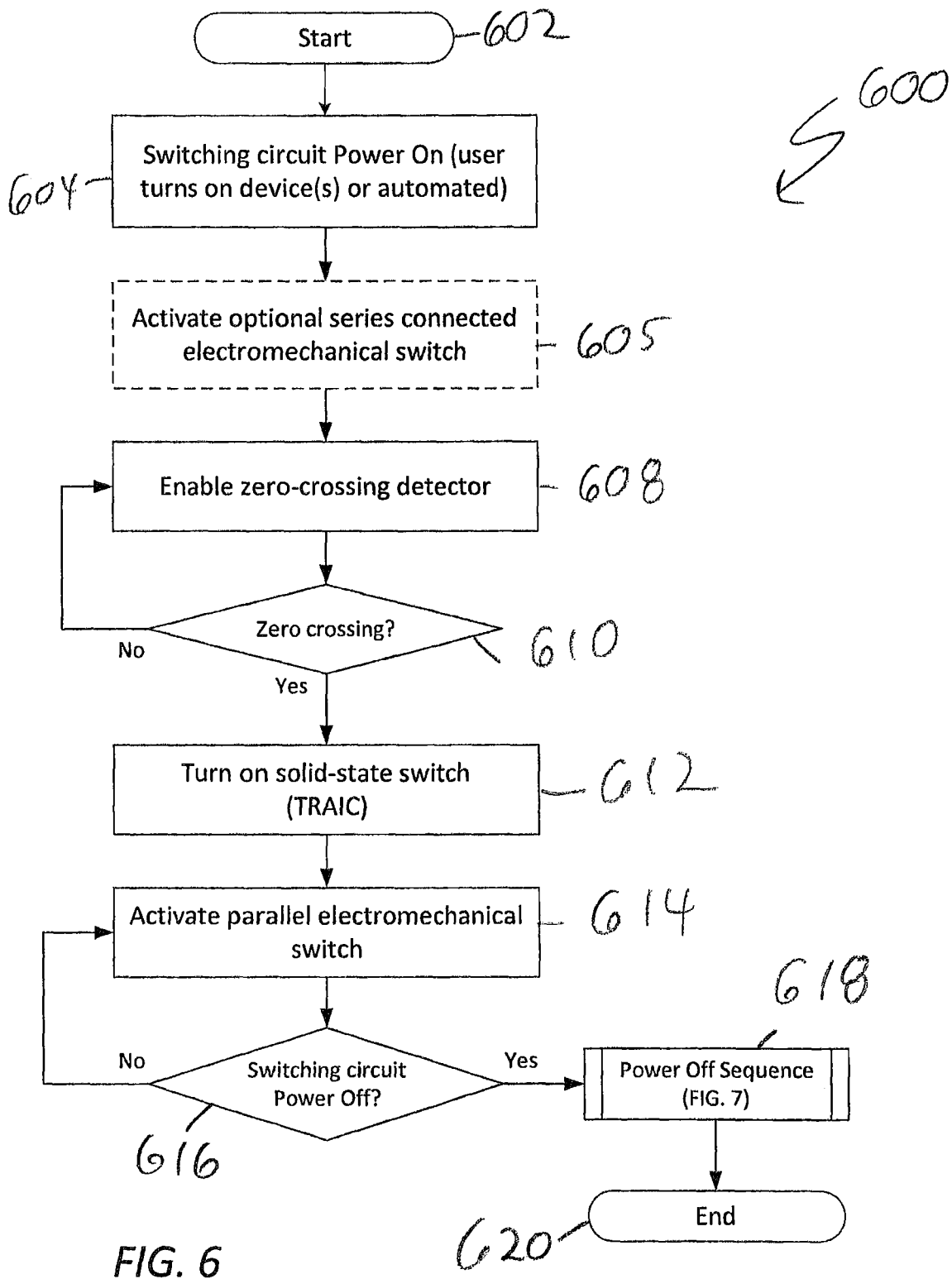
FIG. 6 is a flowchart illustrating the operating process of a switching circuit according to embodiments of the invention.
Figure 7:
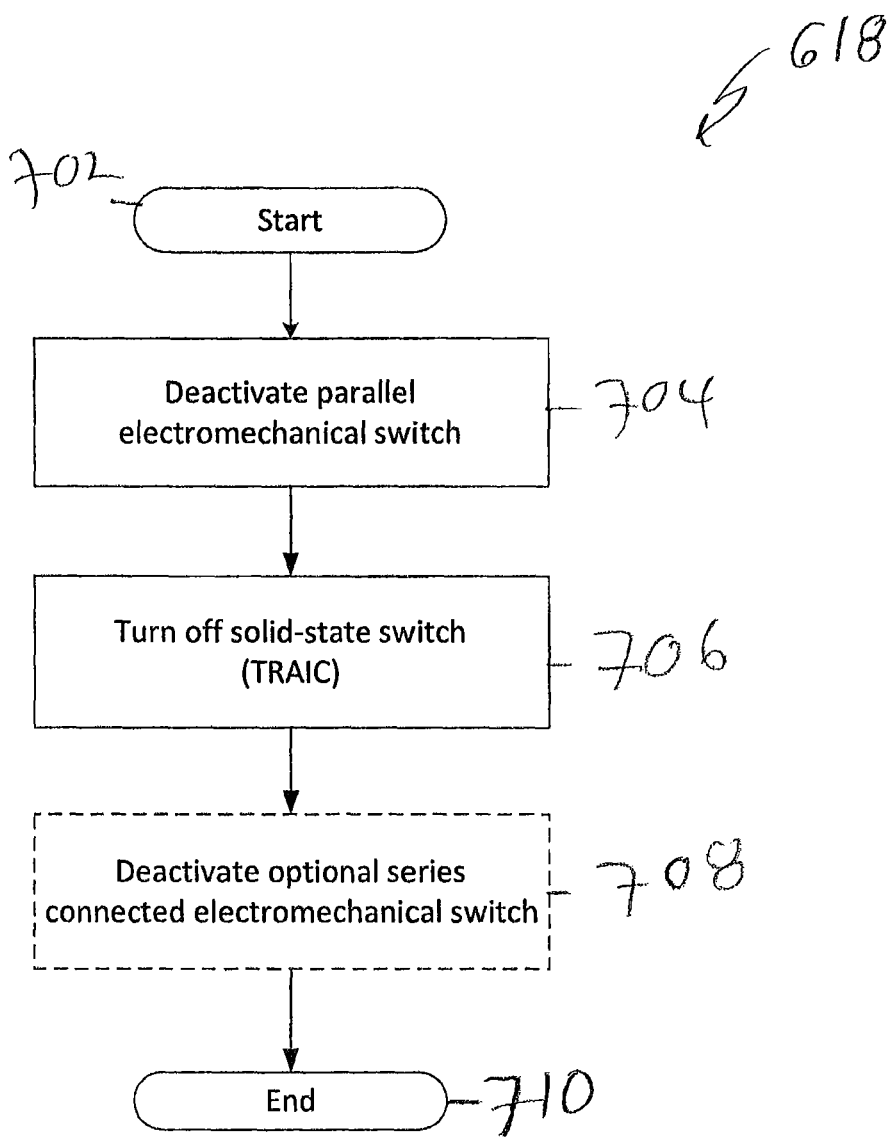
FIG. 7 is a flowchart illustrating one of the subprocesses of the operating process of FIG. 5.

FIG. 6 and FIG. 7 are flowcharts that together illustrate the operation of the switching circuit according to example embodiments of the invention. Like most software flowcharts, FIG. 6 and FIG. 7 illustrate the process as a series of process blocks. In some embodiments, a general-purpose processor such as a digital signal processor, microcontroller, microcontroller unit (MCU) or microprocessor is used and non-transitory firmware, software, or microcode can be stored in a tangible storage medium that is associated with the device. Such a medium may be a memory integrated into the processor, or may be a memory chip that is addressed by the processor to perform control functions. Such firmware, software or microcode is executable by the processor and when executed, causes the microcontroller unit to perform its control functions. Such firmware or software could also be stored in or on a tangible medium such as an optical disk or traditional removable or fixed magnetic medium such as a disk drive used to load the firmware or software into a switching system for maintenance, update, manufacturing, or other purposes.

Process 600 of FIG. 6 begins at block 602. At block 604, the switching circuit is powered on. This can be as a result of building automation and a specific time of day being reached, or a person who is a user of the system could activate a power strip, circuit breaker, or similar device. At block 605, the series-connected electromechanical switch is activated if the series-connected switch is present. At block 608, the zero-crossing detector is enabled and waits for a zero-crossing of the supply voltage. When zero-crossing occurs at block 610, the solid-state switch is turned on at block 612. The parallel-connected electromechanical switch (the "first" electromechanical switch in the circuit descriptions) is turned on at block 614. The circuit remains on, in normal use at 616. If the circuit is powered off by either automation or a user at block 616, the power-off sequence is executed at subprocess block 618 and the process ends at block 620.

FIG. 7 illustrates the power-down process for the switching circuit according to example embodiments of the invention. Subprocess 618 begins at block 702. At block 704, the parallel-connected ("first") electromechanical switch is deactivated. At block 706, the solid-state switch is turned off. At block 708, if present, the series connected ("second") electromechanical switch is deactivated. Subprocess 618 ends at block 710.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A switching circuit to selectively connect a load to a voltage source, the switching circuit comprising:
a high-speed switch connected between the load and the voltage source;
a snubber connected in parallel with the high-speed switch;
a cutoff switch connected between the load and the voltage source in parallel with the high-speed switch;
a level detector and control circuit connected to the voltage source and to a control input of the high-speed switch, wherein the control input is further connected to a portion of the switching circuit that is between the load and an output of the high-speed switch and between the load and an output of the cutoff switch; and
a controller comprising a first enabling input connected to the level detector and control circuit and a second enabling input connected to the cutoff switch, the controller further comprising a processor and memory storing at least one of firmware and software that is executable such that: the first enabling input is activated in response to a powering on signal received from the controller and the level detector and control circuit turns on the high-speed switch at a zero crossing of the voltage source, and the second enabling input is activated independent of the operation of the high-speed switch after the high-speed switch is turned on to turn on the cutoff switch, the high-speed switch remaining turned on after the cutoff switch is turned on.

2. The switching circuit of claim 1 wherein the high-speed switch comprises a solid-state switch.

3. The switching circuit of claim 2 wherein the solid-state switch comprises a triode for alternating current (TRIAC).

4. The switching circuit of claim 2 wherein the solid-state switch comprises bidirectional switch.

5. The switching circuit of claim 1 wherein the cutoff switch comprises an electromechanical switch and further comprising:
a transistor connected to the controller; and
a resistor connected between the transistor and the electromechanical switch.

6. The switching circuit of claim 1 further comprising a second cutoff switch connected in series with the high-speed switch.

7. The switching circuit of claim 6 wherein the cutoff switch, the second cutoff switch, or both the cutoff switch and the second cutoff switch each comprise an electromechanical switch.

8. The switching circuit of claim 7 wherein the electromechanical switch comprises a relay.

9. The switching circuit of claim 6 wherein the second cutoff switch is connected between the high-speed switch and the voltage source.

10. The switching circuit of claim 6 wherein the second cutoff switch is connected between the high-speed switch and the load.

11. A method of selectively connecting a load to an AC voltage through a switching circuit comprising a controller comprising a first enabling input connected to a level detector and control circuit and a second enabling input connected to a cutoff switch, the controller further comprising a processor and memory storing at least one of firmware and software, the method comprising:
activating the first enabling input from the controller in response to a powering on signal received from the controller to thereby enable the level detector and control circuit to turn on a solid-state switch between the AC voltage and the load at zero-crossing of the AC voltage;
suppressing voltage spikes and/or dampening ringing to prevent misfiring of the solid-state switch using a snubber connected in parallel with the solid-state switch; and
activating a second enabling input from the controller to close a first electromechanical switch connected in parallel with the solid-state switch independent of the operation of the solid-state switch after the turning on of the solid-state switch to turn on the cutoff switch, maintaining the solid-state switch turned on after the cutoff switch is turned on using a control input of the solid-state switch that is connected between the load and an output of the solid-state switch and between the load and an output of the cutoff switch.

12. The method of claim 11 further comprising:
in response to a powering off signal received by the controller, deactivating the first electromechanical switch; and
turning off the solid-state switch after deactivating the first electromechanical switch.

13. The method of claim 11 further comprising activating a second electromechanical switch connected in series with the solid-state switch prior to turning on the solid-state switch and in response to activation of the switching circuit.

14. The method of claim 13 further comprising:
deactivating the first electromechanical switch;
turning off the solid-state switch; and
deactivating the second electromechanical switch.

15. The method of claim 11 wherein the solid-state switch comprises bidirectional switch.

16. The switching circuit of claim 1 wherein the high-speed switch is configured to remain turned on for an entire duration that the cutoff switch is turned on.

* * * * *